US012581604B2

(12) United States Patent　　(10) Patent No.:　US 12,581,604 B2

Takahashi et al.　　(45) Date of Patent:　Mar. 17, 2026

(54) SIGNAL PROCESSING DEVICE

(71) Applicant: Yokogawa Electric Corporation, Musashino (JP)

(72) Inventors: Tomoyuki Takahashi, Musashino (JP); Yusaku Yoshida, Musashino (JP); Akio Morita, Musashino (JP); Noriaki Kihara, Musashino (JP); Takahiro Kimura, Musashino (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 308 days.

(21) Appl. No.: 18/219,779

(22) Filed: Jul. 10, 2023

(65) Prior Publication Data

US 2024/0032218 A1　　Jan. 25, 2024

(30) Foreign Application Priority Data

Jul. 22, 2022　　(JP) ................................. 2022-117466

(51) Int. Cl.
*H05K 5/02* (2006.01)
*H05K 5/03* (2006.01)
*H04W 80/00* (2009.01)

(52) U.S. Cl.
CPC ............. *H05K 5/0217* (2013.01); *H05K 5/03* (2013.01); *H04W 80/00* (2013.01)

(58) Field of Classification Search
CPC ....... H05K 5/0217; H05K 5/03; H04W 80/00; H04B 1/3816; H04B 1/08; H04B 1/16;
(Continued)

(56) References Cited

U.S. PATENT DOCUMENTS

| 11,109,310 B1 * | 8/2021 | Crespi ................... H04W 12/03 |
| 2019/0103676 A1 * | 4/2019 | Sugimoto ............... H01Q 1/42 |

(Continued)

FOREIGN PATENT DOCUMENTS

| JP | 3938720 B2 | 6/2007 |
| WO | 2014/001814 A2 | 1/2014 |

OTHER PUBLICATIONS

Extended European Search Report dated Dec. 18, 2023, issued in counterpart EP Application No. 23185380.5 (9 pages).

(Continued)

*Primary Examiner* — Cindy Trandai
(74) *Attorney, Agent, or Firm* — WHDA, LLP

(57) ABSTRACT

A signal processing device (10) according to the present disclosure includes a housing (161), an input interface (12) configured to receive input of an electrical signal, a converter (13) configured to convert the electrical signal inputted to the input interface (12) into a communication signal according to a communication protocol for wireless communication, and an output interface (14) configured to output the communication signal converted by the converter (13) for wireless communication. The signal processing device (10) includes the housing (61), the input interface (12), the converter (13), and the output interface (14) integrally. The input interface (12) is disposed on a first side (S1) of the housing (161), and the output interface (14) is disposed on a second side (S2) opposite the first side (S1) in the housing (161).

8 Claims, 5 Drawing Sheets

(58) Field of Classification Search
    CPC .......... H01Q 1/12; H01Q 1/1264; H01Q 3/06;
                H01Q 3/08; H01Q 1/1207; H01Q 1/246;
                H01Q 1/084; F16M 11/10; F16M 13/022;
                            F16M 13/027; F16B 2/065
    See application file for complete search history.

(56) References Cited

U.S. PATENT DOCUMENTS

| | | | | |
|---|---|---|---|---|
| 2021/0092189 | A1* | 3/2021 | Nakayama | ............... H04B 1/38 |
| 2021/0184356 | A1* | 6/2021 | Ikeda | ........................ H01Q 7/00 |
| 2021/0305689 | A1* | 9/2021 | Leizerovich | ............. H01Q 1/38 |
| 2022/0232451 | A1* | 7/2022 | Sato | ....................... H04W 40/22 |
| 2024/0276665 | A1* | 8/2024 | Takagi | ............... H05K 7/20145 |

OTHER PUBLICATIONS

Teltonika: "RUT 955", Dec. 31, 2021 (Dec. 31, 2021), XP093105991, Retrieved from the Internet: URL: https://www.ime.de/shop/4G-5G-LTE/nach-Anwendung/KFZ-Fahrzeug/www.ime.de/produktdatenblaet-ter/A42352_1.pdf [retrieved on Nov. 27, 2023]. Cited in Extended European Search Report dated Dec. 18, 2023. (15 pages).

Esse-Ti: "4G Router", Dec. 10, 2019 (Dec. 10, 2019), pp. 1-60,XP055734314, Esse-ti official website Retrieved from the Internet: URL: https://www.esse-ti.it/images/manuali/4GRouter_en.pdf [retrieved on Sep. 28, 2020]. Cited in Extended European Search Report dated Dec. 18, 2023. (60 pages).

"Waspmote Technical Guide", Jun. 1, 2014 (Jun. 1, 2014), pp. 1-175, XP055265591, Retrieved from the Internet: URL: http://web.archive.org/web/20140708083920/http://www.libelium.com/downloads/documentation/waspmote_technical_guide.pdf [retrieved on Apr. 14, 2016]. Cited in Extended European Search Report dated Dec. 18, 2023. (175 pages).

Office Action dated Mar. 18, 2025, issued in counterpart JP Application No. 2022-117466, with English translation (6 pages).

Teltonika Network, "RUT 955-Data sheet", 2020, Retrieved from the Internet: https://download.discomp.cz/Teltonika/Datasheets/RUT955-Datasheet.pdf [retrieved on Mar. 11, 2025]; cited in JP Office Action dated Mar. 18, 2025.(15 pages).

* cited by examiner

SIGNAL PROCESSING DEVICE

CROSS-REFERENCE TO RELATED APPLICATION

The present application claims priority to Japanese Patent Application No. 2022-117466 filed on Jul. 22, 2022, the entire contents of which are incorporated herein by reference.

TECHNICAL FIELD

The present disclosure relates to a signal processing device.

BACKGROUND

Technology has been developed for wireless communication. For example, Patent Literature (PTL) 1 discloses a diversity receiver connector unit that enables simple connection between a plurality of antenna cables, which are capable of simultaneously receiving a plurality of radio waves, and a printed circuit board that includes an integrated circuit configuring a diversity receiver. This connector unit also achieves a reduction in size of the printed circuit board.

On the other hand, in various fields, including the field of instrumentation, signal processing devices that receive electrical signals outputted from sensors and the like and convert the signals to digital signals are known. In recent years, demand has increased for use of such signal processing devices in wireless connection and other applications.

CITATION LIST

Patent Literature

PTL 1: JP 3938720 B2

SUMMARY

A signal processing device according to several embodiments includes:
 a housing;
 an input interface configured to receive input of an electrical signal;
 a converter configured to convert the electrical signal inputted to the input interface into a communication signal according to a communication protocol for wireless communication; and
 an output interface configured to output the communication signal converted by the converter for wireless communication, wherein
 the signal processing device includes the housing, the input interface, the converter, and the output interface integrally, and
 the input interface is disposed on a first side of the housing, and the output interface is disposed on a second side opposite the first side in the housing.

BRIEF DESCRIPTION OF THE DRAWINGS

In the accompanying drawings.

DETAILED DESCRIPTION

Figure 1:
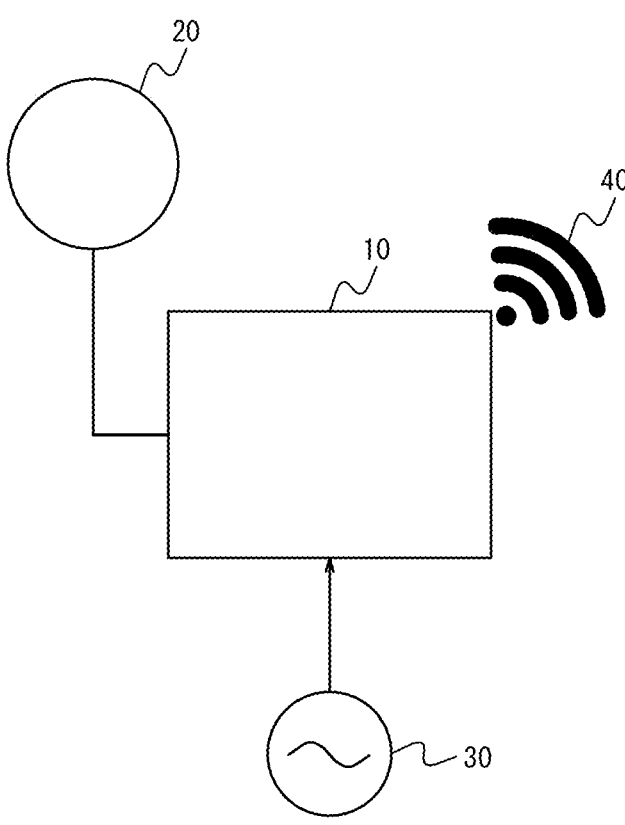
FIG. 1 is a diagram schematically illustrating a configuration of a wireless communication system including a signal processing device according to an embodiment of the present disclosure.

In the case of using a conventional signal processing device to achieve wireless connection, however, it has been necessary to separately prepare a wireless device with wireless input/output functions in addition to the signal processing device with a signal input function. This reduces convenience when achieving wireless connection.

It would be helpful to provide a signal processing device that can improve the convenience when achieving wireless connection.

A signal processing device according to several embodiments includes:
 a housing;
 an input interface configured to receive input of an electrical signal;
 a converter configured to convert the electrical signal inputted to the input interface into a communication signal according to a communication protocol for wireless communication; and
 an output interface configured to output the communication signal converted by the converter for wireless communication, wherein
 the signal processing device includes the housing, the input interface, the converter, and the output interface integrally, and
 the input interface is disposed on a first side of the housing, and the output interface is disposed on a second side opposite the first side in the housing.

This configuration can improve convenience when achieving wireless connection. By the signal processing device including the input interface, the converter, and the output interface integrally, installation space in the control panel is not required for both the signal processing device and the wireless output device. The signal processing device can support wireless connection and other applications with only the same installation space as that of a conventional signal processing device. Even if there is no space for expansion, an existing system can be switched to wireless connection, for example, simply by replacing the existing signal processing device with the signal processing device according to an embodiment. For example, by the signal processing device integrally housing the input interface, the converter, and the output interface in a housing with a size equivalent to that of an existing German Industrial Standard (DIN)-mounted signal processing device compliant with DIN standards, wireless connection can be supported by simple replacement of the existing signal processing device.

In a signal processing device according to an embodiment, the output interface may include an antenna cable connector to which a cable, connected to a wireless communication antenna, is connected. This enables the distance between the wireless communication antenna and the input interface 12 to be further increased by the length of the cable. By disposing the output interface, including the antenna cable connector, on the front in the signal processing device, the bending radius of the cable can be more easily maintained than when the output interface is disposed on the back. In greater detail, space is necessarily provided on the front of the signal processing device for the user to perform operations such as mounting the cable, and the cable can be disposed with a large bending radius within such space. The signal processing device can be easily installed in a limited space, such as inside a control panel, and other devices can be arranged closely on both sides. By the antenna cable connector of the wireless communication antenna being disposed on the front of the signal processing device, devices can be lined up on a DIN rail without gaps. The signal processing device can thus achieve the same level of mounting density as existing signal processing devices.

In a signal processing device according to an embodiment, the cable may be a coaxial cable, and the antenna cable connector may be a coaxial connector. This enables the signal processing device to stably output communication signals from the output interface to the wireless communication antenna while receiving a noise shielding effect from the coaxial cable.

In a signal processing device according to an embodiment, the antenna cable connector and the housing need not be electrically connected to each other. This enables the signal processing device to electrically isolate the antenna cable connector and the housing from each other.

In a signal processing device according to an embodiment, the housing may be formed from resin. This enables a reduction in weight of the housing.

A signal processing device according to an embodiment may further include a mounting structure for mounting the signal processing device on a control panel, and the input interface and the mounting structure may be disposed on the first side. This makes it possible to arrange wires such as signal wires, which can have a smaller bending radius than coaxial cables, in areas where space is reduced due to mounting on a DIN rail or the like.

A signal processing device according to an embodiment may further include an insertion slot for a recording medium having recorded thereon setting information regarding the wireless communication, and the output interface and the insertion slot may be disposed on the second side. With this configuration, a recording medium such as a Subscriber Identity Module (SIM) card can be inserted and replaced in the signal processing device without removing the signal processing device from the control panel or removing wiring from the signal processing device. The user can thereby easily replace the recording medium in the event of failure, a line change, or the like.

A signal processing device according to an embodiment may further include a cover member configured to cover the insertion slot. With this configuration, the signal processing device can be provided with a function to cover the insertion slot. Inclusion of the cover member for the insertion slot enables the signal processing device to hide the insertion slot from the user and make the insertion slot inconspicuous. Inclusion of the cover member for the insertion slot also enables the signal processing device to prevent the recording medium from falling out of the insertion slot. Inclusion of the cover member for the insertion slot also enables the signal processing device to prevent a malicious third party from damaging the recording medium inserted into the insertion slot.

In a signal processing device according to an embodiment, the cover member may be made of metal or resin. A cover member made of metal is stronger, enabling the signal processing device to achieve more significantly the various protective effects described above with regard to the recording medium inserted into the insertion slot. In a case in which the cover member is made of resin, the signal processing device can achieve a reduction in weight of the cover member.

According to the present disclosure, a signal processing device that can improve convenience when achieving wireless connection can be provided.

The background and problems with conventional technology are described in greater detail.

Signal processing devices are used in various fields, such as instrumentation; environmental measurement; monitoring of distributed devices; condition monitoring of consumables, factory equipment, and the like; disaster prevention monitoring of water level, air pollution, and the like; and environmental monitoring in areas such as geothermal development. Such signal processing device convert electrical signals acquired from sensors into digital signals and output the digital signals to a personal computer (PC) or other device that is connected to the signal processing device in a wired manner.

In the case of switching to wireless connection using such a signal processing device, it is necessary to separately prepare a wireless output device that has the function of wireless output in addition to the relevant signal processing device in the wireless connection system. The electrical signal outputted from the sensor is inputted to the signal processing device, which converts the electrical signal into a digital signal. The digital signal outputted from the signal processing device is then inputted to the wireless output device and converted into a communication signal according to a communication protocol for wireless communication. Wireless communication is then performed by the wireless output device.

The communication signal transmitted from the wireless output device is received by a wireless receiving device installed at a location remote from the wireless output device. The wireless receiving device outputs the received communication signal as a digital signal to a PC or the like. The PC is communicably connected to a network and transmits the digital signals acquired from the wireless receiving device to a central management server and cloud system or the like via the network as necessary.

In the above-described conventional wireless connection system, the signal processing device is mounted via a predetermined mounting structure on a DIN rail installed in a control panel. Similarly, the wireless output device is installed near the signal processing device in the control panel, for example.

The conventional wireless connection system described above has the following problems.

For example, as described above, the signal processing device that receives electrical signals from sensors and converts the electrical signals into digital signals is often mounted on a DIN rail and housed in a control panel. If such an existing sensor is to be switched to wireless connection or the like, it is necessary to configure the signal processing device with the function of signal input and the wireless output device with the function of wireless output as two separate devices. Therefore, installation space is needed in the control panel for both the signal processing device and the wireless output device.

It has not been easy to add a new wireless output device to a signal processing device in a control panel with limited installation space for devices. In addition, most existing wireless output devices are of a type that requires the wireless reception device to be installed at a distance from the wireless output device, thus making a separate space necessary for installing the wireless reception device in addition to the wireless output device.

In addition, a conventional wireless connection system includes a plurality of devices, such as a signal processing device, a wireless output device, a wireless reception device, and a PC, as described above. It is also necessary to supply power to each of these devices in a conventional wireless connection system.

On the other hand, there are various types of conventional wireless output devices.

For example, a conventional wireless output device according to a first example includes, on the front of a housing, an input interface configured to receive input of an analog signal and an output interface including an antenna cable connector that outputs a communication signal to an antenna via a coaxial cable or the like for wireless communication.

In this conventional wireless output device according to the first example, analog signals and communication signals for wireless communication are mixed in close proximity to each other. Therefore, if the device is not correctly wired by a specialist with knowledge of signal interference, problems such as degradation of communication quality and noise in the analog signals could occur.

For example, a conventional wireless output device according to a second example includes an insertion slot for inserting a SIM card behind a cover on the front of the housing and includes a wiring interface on the front of the housing. The SIM insertion slot is disposed behind the cover on the front of the housing, and a SIM card can be inserted by unscrewing and removing the cover on the front of the housing.

When such a wireless output device is used for cellular communication, a SIM card provided by the communication carrier is typically used. When use of cellular communication begins, the SIM card has to be inserted into the SIM insertion slot of the wireless output device. In addition, to support use overseas, a structure that allows SIM cards to be interchanged is necessary, since SIMs differ by country.

In wireless output devices with a cellular communication function, however, a cover is typically provided by being screwed to the SIM insertion slot. Reasons for this include that the inserted SIM card is normally used as it is during the contract period, and that the cover prevents the SIM card from spontaneously falling out due to gravity, vibration, or the like, causing poor contact.

Therefore, when inserting or replacing a SIM card, work is required to unscrew the cover of the wireless output device and expose the SIM insertion slot. Depending on the installation configuration of the wireless output device, such work cannot not be performed without removing the wireless output device from its installation location due to other devices and wiring located adjacent to the wireless output device.

For example, a wireless output device according to a third conventional example includes, on the back of a housing, an output interface including an antenna cable connector that outputs a communication signal to an antenna via a coaxial cable or the like. In the case of mounting such an antenna cable connector on the back or the side of the housing, the placement of the wireless output device is often restricted due to the fact that the bending radius of the coaxial cable connected to the antenna cable connector is larger than that of wires such as signal wires and power supply wires.

In light of these problems, it would be helpful to provide a signal processing device that can improve convenience when achieving wireless connection. Embodiments of the present disclosure are mainly described below with reference to the drawings.

FIG. 1 is a diagram schematically illustrating a configuration of a wireless communication system 1 including a signal processing device 10 according to an embodiment of the present disclosure. Referring to FIG. 1, the schematic configuration of the wireless communication system 1 is now mainly described.

In addition to the signal processing device 10, the wireless communication system 1 includes a sensor 20 that outputs an electrical signal to the signal processing device 10, a power source 30 that supplies power to the signal processing device 10, and a wireless network 40 to which the signal processing device 10 is communicably connected. In the present disclosure, the "electrical signal" includes, for example, analog signals. The signal processing device 10 is communicably connected to the wireless network 40, converts the acquired electrical signal into a communication signal, and transmits the communication signal to a central management server and cloud system or the like via the wireless network 40.

The sensor 20 includes any sensor that executes a measurement process on a physical quantity to be measured and outputs the measured value as an electrical signal. In the present disclosure, the "physical quantity" includes, for example, the temperature, pressure, flow rate, and Ph of fluids, including gases and liquids, generated at the plant facility where the sensor 20 is installed, along with the degree of corrosion, vibration, and the like of the plant facility. These examples are not limiting, and the physical quantity may include state parameters, including temperature, pressure, or the like, associated with actuators such as valves, motors, and relays.

In addition to an industrial plant such as a chemical plant, examples of the "plant facility" in the present disclosure include a plant for managing a well site, such as a gas field or oil field, and the surrounding area. Additional examples of the plant facility may include a plant for managing power generation such as hydropower, thermal power, or nuclear power; a plant for managing environmental power generation such as solar power or wind power; and a plant for managing water and sewage, a dam, or the like.

The signal processing device 10 can be used in various fields, such as instrumentation; environmental measurement; monitoring of distributed devices; condition monitoring of consumables, factory equipment, and the like; disaster prevention monitoring of water level, air pollution, and the like; and environmental monitoring in areas such as geothermal development. The signal processing device 10 operates by receiving power supplied by the power source 30. The signal processing device 10 accepts input of the electrical signal outputted by the sensor 20. The signal processing device 10 converts the electrical signal acquired from the sensor 20 into a communication signal according to a communication protocol for wireless communication and transmits the communication signal to the wireless network 40.

Figure 2:
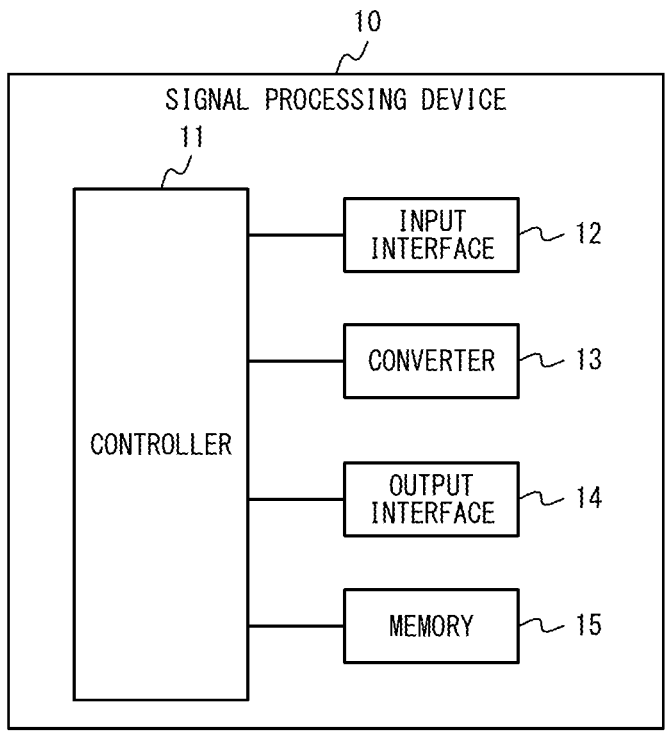
FIG. 2 is a functional block diagram illustrating a portion of the configuration of the signal processing device in FIG. 1.

FIG. 2 is a functional block diagram illustrating a portion of the configuration of the signal processing device 10 in FIG. 1. Referring to FIG. 2, a portion of the configuration of the signal processing device 10 is now mainly described.

The signal processing device 10 integrally includes a controller 11, an input interface 12, a converter 13, an output interface 14, and a memory 15.

The controller 11 includes one or more processors. The "processor" in an embodiment is a general purpose processor or a dedicated processor specialized for particular processing, but these examples are not limiting. The controller 11 is communicably connected with each component of the signal processing device 10 and controls operations of the signal processing device 10 overall.

The input interface 12 includes any appropriate interface for input. For example, the input interface 12 includes any appropriate connector to which a wire is connected, such as a signal wire in which an electrical signal outputted from the sensor 20 flows. An electrical signal is inputted to the input interface 12. For example, an electrical signal that is outputted from the sensor 20 and flows through a wire, such as a signal wire, is inputted to the input interface 12.

The converter 13 includes any conversion module that converts the electrical signal inputted to the input interface 12 into a communication signal according to a communication protocol for wireless communication. In the present disclosure, "wireless communication" includes, for example, cellular communication to enable the signal processing device 10 to connect to and communicate with the wireless network 40. The "communication protocol" includes, for example, protocols compliant with such cellular communication. The "communication signal" includes, for example, digital signals.

The output interface 14 includes any appropriate interface for output. For example, the output interface 14 includes any appropriate antenna cable connector to which a cable, connected to a wireless communication antenna, is connected. In the present disclosure, the "cable" is, for example, a coaxial cable. The "antenna cable connector" is, for example, a coaxial connector. Coaxial connectors include, for example, connectors based on types such as SMA, SMB, QMA, MCX, 4.3/10, and N. The output interface 14 outputs the communication signal converted by the converter 13 for wireless communication. The communication signal outputted from the output interface 14 reaches the antenna through the coaxial cable and is transmitted from the antenna for wireless communication. The signal processing device 10 is connected to communicate directly with a cellular communication network, for example, via the output interface 14. In other words, the signal processing device 10 does not require a wireless transmission device as a separate device as in a conventional configuration of the wireless communication system 1.

The memory 15 includes any memory module, including a Hard Disk Drive (HDD), Solid State Drive (SSD), Electrically Erasable Programmable Read-Only Memory (EEPROM), Read-Only Memory (ROM), and Random Access Memory (RAM). The memory 15 functions as, for example, a main memory, an auxiliary memory, or a cache memory. The memory 15 is not limited to being internal to the signal processing device 10 and may include an external storage module connected through a digital input/output port or the like, such as universal serial bus (USB).

Figure 3:
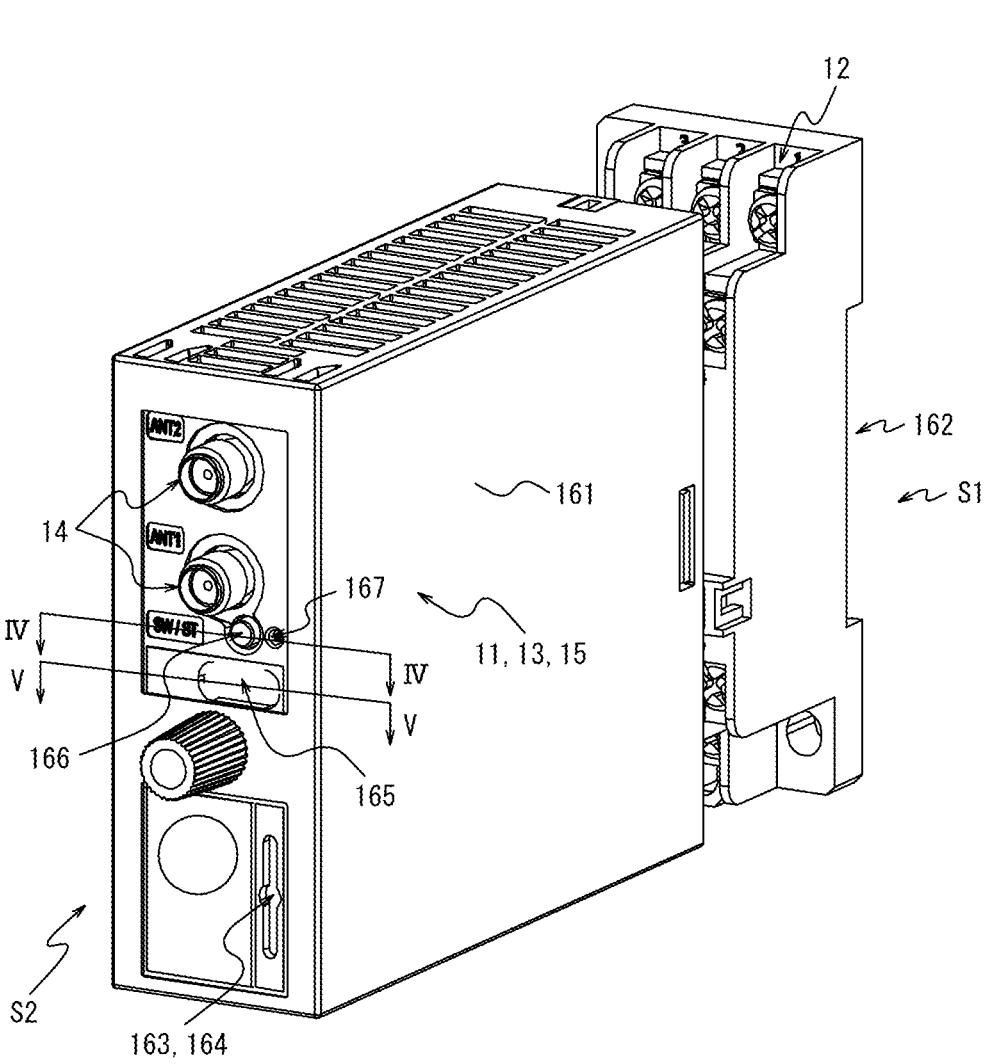
FIG. 3 is a perspective view illustrating the appearance of the signal processing device in FIG. 2.

FIG. 3 is a perspective view illustrating the appearance of the signal processing device 10 in FIG. 2. In addition to each of the components illustrated in FIG. 2, the signal processing device 10 includes a housing 161, a mounting structure 162, an insertion slot 163, a cover member 164, a USB connector 165, a push switch 166, and a light-emitting diode (LED) 167.

The housing 161 is formed from any appropriate material and constitutes the external form of the signal processing device 10. For example, the housing 161 is formed from resin. The antenna cable connector included in the output interface 14 and the housing 161 are not electrically connected to each other. The housing 161 has a first side S1 forming the back and a second side S2 forming the front opposite the back.

The housing 161 houses therein a portion of the components of the signal processing device 10 or holds another portion in a mountable manner on the surface thereof. In greater detail, the controller 11, the converter 13, the memory 15, and the circuit board 168, described below, are located inside the housing 161, which holds these components therein. The housing 161 holds the input interface 12 on the first side S1. The housing 161 holds the output interface 14 on the second side S2. The housing 161 also includes a mounting structure 162 on the first side S1. The housing 161 holds the insertion slot 163, the cover member 164, the USB connector 165, the push switch 166, and the LED 167 on the second side S2. The housing 161 is formed to have an external shape and size that are common with those of a conventional signal processing device that does not include the converter 13 and is not directly configured for wireless connection.

The mounting structure 162 includes any structure for mounting the signal processing device 10 on a control panel. For example, the mounting structure 162 includes a structure that is compatible with a DIN rail installed in a control panel. The signal processing device 10 is mounted by the mounting structure 162 onto any location, such as within a control panel. For example, the signal processing device 10 is installed within the control panel by being mounted to the DIN rail via the mounting structure 162.

The insertion slot 163 is configured for insertion of a recording medium having recorded thereon setting information regarding wireless communication. In the present disclosure, the "recording medium" includes, for example, a SIM card. The converter 13 converts an electrical signal to a communication signal using the aforementioned setting information. The insertion slot 163 is additionally installed in a conventional signal processing device that does not have a converter 13 and is not directly configured for wireless connection. The insertion slot 163 is disposed in the lower part of the second side S2, near the side edge of the second side S2.

The cover member 164 is a metal or plastic member that covers the insertion slot 163. The cover member 164 may, for example, be made of the same material as a label, attached to the left side of the insertion slot 163 at the bottom of the second side S2 of the housing 161, on which product information or the like is recorded.

The USB connector 165 is used only during the manufacturing of the signal processing device 10. For example, the USB connector 165 is used during the manufacturing of the signal processing device 10 when the manufacturer writes software for operating the signal processing device 10 into the memory 15. The USB connector 165 is covered by a cover formed of the same material as the label, for example, when the user actually uses the signal processing device 10 and thus is not used at this time.

The push switch 166 includes any switch that turns the power to the signal processing device 10 on and off. The LED 167 turns on when the power is on and the signal processing device 10 is operating, for example, and turns off when the power is off and the signal processing device 10 is not operating. The LED 167 is used to inform the user using the signal processing device 10 of the operating status of the signal processing device 10.

In the signal processing device 10, the input interface 12 is disposed on the first side S1 of the housing 161. The mounting structure 162 is disposed on the first side S1 together with the input interface 12. The output interface 14 is disposed on the second side S2 opposite the first side S1 in the housing 161. The insertion slot 163 is disposed on the second side S2 together with the output interface 14. In addition to the output interface 14 and the insertion slot 163, a cover member 164, a USB connector 165, a push switch 166, and an LED 167 are mounted on the second side S2.

Figure 4:
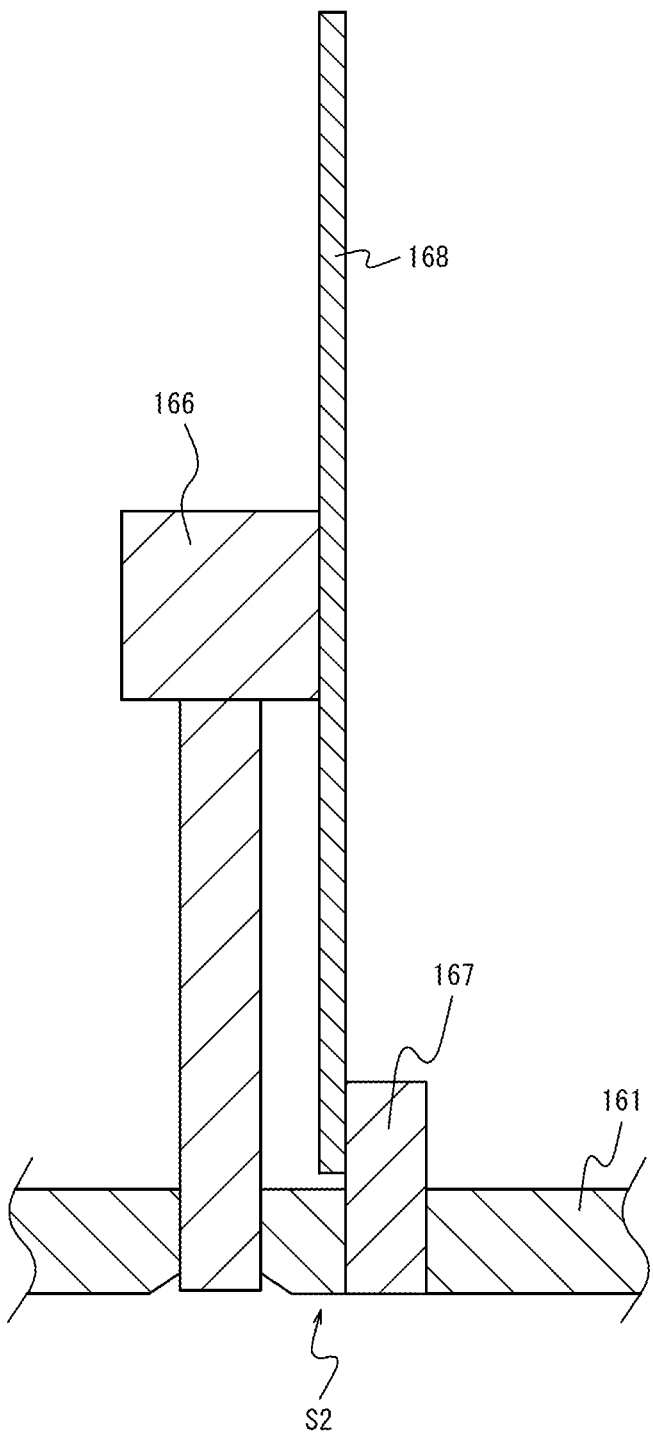
FIG. 4 is a cross-sectional view schematically depicting a portion of a cross-section along the IV-IV line in FIG. 3.

FIG. 4 is a cross-sectional view schematically depicting a portion of a cross-section along the IV-IV line in FIG. 3.

In the signal processing device 10, the push switch 166 and the LED 167 are arranged adjacent to each other on the second side S2. The circuit board 168 on which the push switch 166 and the LED 167 are mounted is housed inside the housing 161. The push switch 166 and the LED 167 are surface mounted components on the circuit board 168. The push switch 166 and the LED 167 are respectively mounted on either side of the circuit board 168.

The push switch 166 is formed in the shape of a long nose. That is, the footprint of the push switch 166 on the circuit board 168 extends far from the second side S2 of the housing 161 and is located farther inside the housing 161 than the footprint of the LED 167. Only the tip of the push switch 166 is exposed to the outside of the housing 161 from the second side S2. The edge of the opening in the second side S2 where the tip of the push switch 166 is located is chamfered. Nearly the entire push switch 166 is housed inside the housing 161. Only the tip of the LED 167 is exposed to the outside of the housing 161 from the second side S2. Nearly the entire LED 167 is housed inside the housing 161.

Figure 5:
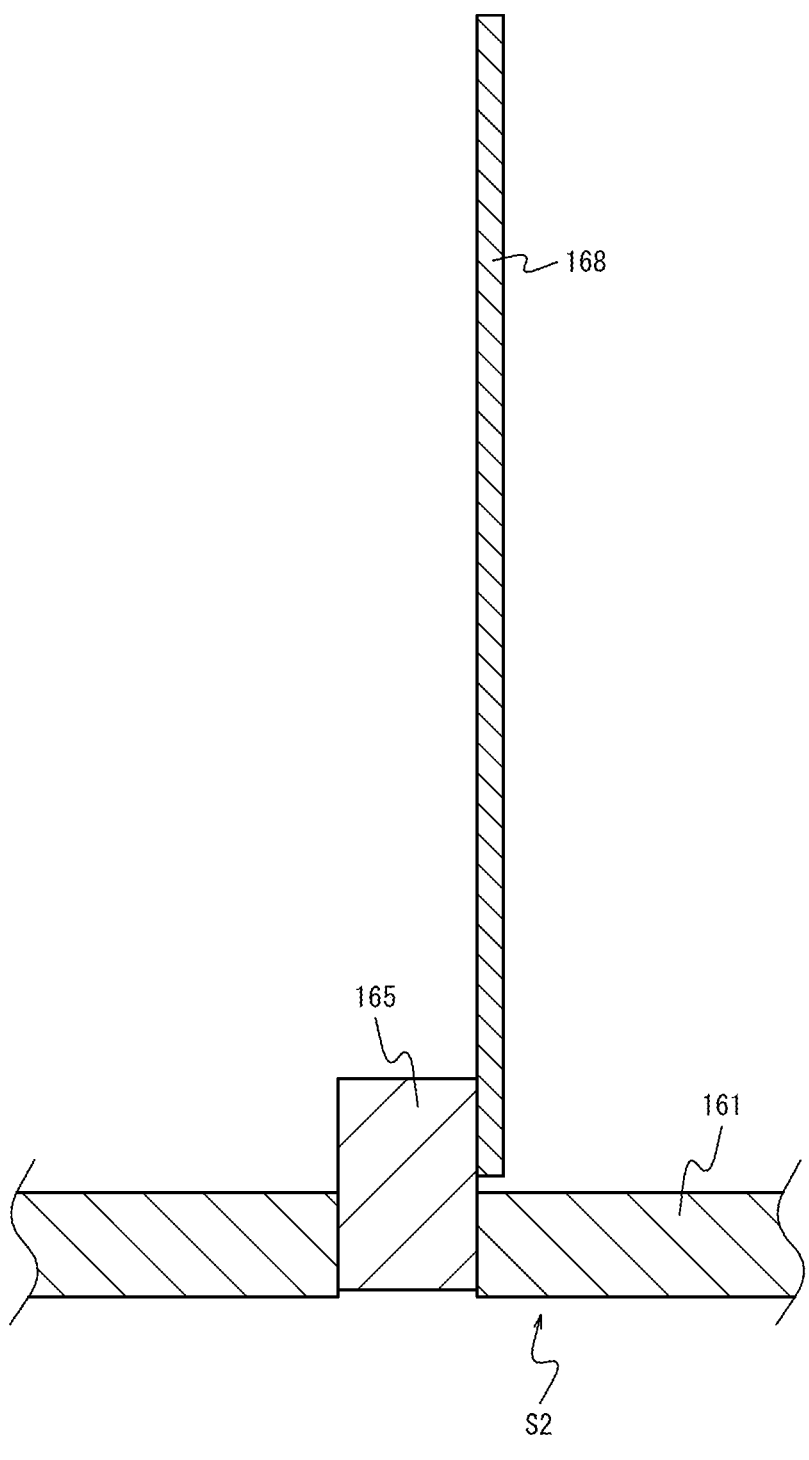
FIG. 5 is a cross-sectional view schematically depicting a portion of a cross-section along the V-V line in FIG. 3.

FIG. 5 is a cross-sectional view schematically depicting a portion of a cross-section along the V-V line in FIG. 3.

In the signal processing device 10, the USB connector 165 is disposed directly below the push switch 166 and the LED 167 on the second side S2. The USB connector 165 is mounted on the circuit board 168. The USB connector 165 is a surface mounted component on the circuit board 168. The USB connector 165 is mounted to be oriented vertically to the circuit board 168. In other words, the USB connector 165 is mounted on the circuit board 168 with the side with a small area in the outline of the USB connector 165 as the mounting surface.

Only the tip of the USB connector 165 is exposed to the outside of the housing 161 from the second side S2. The tip of the USB connector 165 fits into an opening formed in the second side S2 of the housing 161. Nearly the entire USB connector 165 is housed inside the housing 161.

According to the signal processing device 10 in the above embodiment, convenience can be improved when achieving wireless connection. By the signal processing device 10 including the input interface 12, the converter 13, and the output interface 14 integrally, installation space in the control panel is not required for both the signal processing device and the wireless output device. The signal processing device 10 can support wireless connection and other applications with only the same installation space as that of a conventional signal processing device. Even if there is no space for expansion, an existing system can be switched to wireless connection, for example, simply by replacing the existing signal processing device with the signal processing device 10 according to an embodiment. For example, by the signal processing device 10 integrally housing the input interface 12, the converter 13, and the output interface 14 in the housing 161 with a size equivalent to that of an existing DIN-mounted signal processing device, wireless connection can be supported by simple replacement of the existing signal processing device.

In addition, the wireless communication system 1 using the signal processing device 10 does not need to supply power to each of a plurality of devices as in a conventional wireless system, but rather only to the signal processing device 10 in the same manner as power is supplied to a conventional signal processing device. In other words, the power source 30 supplies power to the controller 11, the converter 13, the memory 15, the LED 167, the circuit board 168, and the like within one signal processing device 10.

By having the input interface 12 and the output interface 14 disposed on opposite sides of each other in the housing 161, the signal processing device 10 can suppress noise caused by wiring paths. In greater detail, by separating the output interface 14, including the antenna cable connector, from the input interface 12, the signal processing device 10 can maintain a distance between the communication signal for wireless communication and the electrical signal as the inputted analog signal. The signal processing device 10 can suppress interference between these signals. As a result, the signal processing device 10 can suppress trouble, such as a decrease in communication quality and noise contamination of analog signals. The signal processing device 10 can thereby improve convenience when achieving wireless connection.

By having the output interface 14 include the antenna cable connector to which the cable connected to the wireless communication antenna is connected, the signal processing device 10 can further increase the distance between the wireless communication antenna and the input interface 12 by the length of the cable. By disposing the output interface 14, including the antenna cable connector, on the front in the signal processing device 10, the bending radius of the cable can be more easily maintained than when the output interface is disposed on the back. In greater detail, space is necessarily provided on the front of the signal processing device 10 for the user to perform operations such as mounting the cable, and the cable can be disposed with a large bending radius within such space. The signal processing device 10 can be easily installed in a limited space, such as inside a control panel, and other devices can be arranged closely on both sides. By the antenna cable connector of the wireless communication antenna being disposed on the front of the signal processing device 10, devices can be lined up on a DIN rail without gaps. The signal processing device 10 can thus achieve the same level of mounting density as existing signal processing devices.

Since the cable is a coaxial cable and the antenna cable connector is a coaxial connector, the signal processing device 10 can stably output communication signals from the output interface 14 to the wireless communication antenna while receiving the noise shielding effect from the coaxial cable.

The signal processing device 10 can electrically isolate the antenna cable connector and the housing 161 from each other by not electrically connecting the antenna cable connector and the housing 161 to each other.

The signal processing device 10 can reduce the weight of the housing 161 by having the housing 161 be formed by resin.

In the signal processing device 10, the input interface 12 and the mounting structure 162 are disposed on the first side S1, making it possible to arrange wires such as signal wires, which can have a smaller bending radius than coaxial cables, in areas where space is reduced due to mounting on a DIN rail or the like.

In the signal processing device 10, the insertion slot 163 is disposed on the front of the housing 161, making it possible to insert and replace a recording medium, such as a SIM card, without removing the signal processing device 10 from the control panel or removing wiring from the signal processing device 10. The user can thereby easily replace the recording medium in the event of failure, a line change, or the like.

In the signal processing device 10, the cover member 164 is formed of the same material as the label, making it easy to remove the cover member 164 during the above-described work. Therefore, the signal processing device 10 can maintain the above-described workability.

By further including the cover member 164 covering the insertion slot 163, the signal processing device 10 can be provided with a function to cover the insertion slot 163. Inclusion of the cover member 164 for the insertion slot 163 enables the signal processing device 10 to hide the insertion slot 163 from the user and make the insertion slot 163 inconspicuous. Inclusion of the cover member 164 for the insertion slot 163 also enables the signal processing device 10 to prevent the recording medium from falling out of the insertion slot 163. Inclusion of the cover member 164 for the insertion slot 163 also enables the signal processing device 10 to prevent a malicious third party from damaging the recording medium inserted into the insertion slot 163.

A cover member 164 made of metal is stronger, enabling the signal processing device 10 to achieve more significantly the various protective effects described above with regard to the recording medium inserted into the insertion slot 163. In a case in which the cover member 164 is made of resin, the signal processing device 10 can achieve a reduction in weight of the cover member 164.

When a conventional signal processing device is replaced with the signal processing device 10, the original installation site can be used as is, since the housing 161 in the signal processing device 10 is formed to have the same external shape and size as those of a conventional signal processing device that does not include the converter 13 and is not directly wireless. In addition, a common mold can be used to manufacture the housing 161, which can reduce the costs associated with the manufacturing of the signal processing device 10.

By the push switch 166 and the LED 167 being respectively mounted on either side of the circuit board 168, the signal processing device 10 can effectively utilize the limited mounting space of the circuit board 168 while concentrating the interface on the front of the housing 161, which is frequently accessed by the user.

The signal processing device 10 can suppress interference between components mounted on the circuit board 168 by having the push switch 166 formed in the shape of a long nose. The signal processing device 10 makes it possible to concentrate the interface at the front of the housing 161 while effectively utilizing the limited mounting space of the circuit board 168.

The signal processing device 10 can reduce the mounting area on the circuit board 168 by having the USB connector 165 mounted to be oriented vertically to the circuit board 168. This enables more circuit components to be mounted on the circuit board 168, thereby improving the mounting density of the signal processing device 10.

The signal processing device 10 can improve the mounting strength of the USB connector 165 relative to the circuit board 168 and the housing 161 even when the USB connector 165 is mounted vertically onto the circuit board 168 by fitting the tip of the USB connector 165 into the opening formed in the second side S2 of the housing 161. As a result, even when an external force is applied to the USB connector 165, the signal processing device 10 can receive the external force with the housing 161 and suppress damage to the USB connector 165.

By the insertion slot 163 being disposed near the side edge of the second side S2 at the bottom of the second side S2, the signal processing device 10 can have a layout that concentrates the interface at the front while enabling display of a label at the bottom of the second side S2, as in conventional products.

The signal processing device 10 can improve operability for the user with respect to the push switch 166 by forming the edge of the opening of the second side S2, where the tip of the push switch 166 is located, to be chamfered. The user can easily press the push switch 166.

The signal processing device 10 enables differentiation of the interface used during manufacturing by having the USB connector 165 be used only during manufacturing and covered by a cover or the like at other times. The signal processing device 10 can suppress misuse of the USB connector 165 by users during actual use of the signal processing device 10 while facilitating access to the USB connector 165 by the manufacturer during manufacturing.

It will be clear to a person of ordinary skill in the art that the present disclosure may be implemented in certain ways other than the above embodiments without departing from the spirit or essential features thereof. Accordingly, the above explanation merely provides examples that are in no way limiting. The scope of the present disclosure is to be defined by the appended claims, not by the above explanation. Among all changes, various changes that are within the range of equivalents are considered to be included therein.

For example, the shape, size, arrangement, orientation, and number of the above-described components are not limited to the above explanation or the drawings. The shape, size, arrangement, orientation, and number of each component may be selected freely as long as the functions of the component can be achieved.

In the above embodiment, an example of the electrical signal including an analog signal has been described, but this configuration is not limiting. The electrical signal may include a digital signal. For example, digital signals may include on or off signals outputted from valves, motors, relays, or the like. The electrical signal has been described as being outputted from the sensor 20, but this configuration is not limiting. The electrical signal may be outputted from any output source.

In the above embodiment, the wireless communication has been described as including cellular communication, but this configuration is not limiting. Wireless communication may, for example, include any communication that enables the signal processing device 10 to connect to and communicate with the wireless network 40.

In the above embodiment, the output interface 14 has been described as including any antenna cable connector to which a cable connected to an wireless communication antenna is connected. The output interface 14 need not include such an antenna cable connector. In this case, the wireless communication antenna may be directly mounted onto the housing 161.

In the above embodiment, the cable has been described as a coaxial cable and the antenna cable connector as a coaxial connector, but this configuration is not limiting. The cable may be any cable other than a coaxial cable, and the antenna cable connector may also be any other connector compatible with the cable.

In the above embodiment, the antenna cable connector and the housing 161 have been described as not being electrically connected to each other, but this configuration is not limiting. The antenna cable connector and the housing 161 may be electrically connected to each other. For example, in the signal processing device 10, the housing 161 may be formed of metal, and the antenna cable connector and the housing 161 may be grounded to each other, similar to a normal coaxial connector.

In the above embodiment, the housing 161 has been described as being formed from resin, but this configuration is not limiting. The housing 161 may be formed from metal.

In the above embodiment, the input interface 12 and the mounting structure 162 have been described as being disposed on the first side S1, but this configuration is not limiting. The mounting structure 162 may be disposed on any side of the housing 161 other than the first side S1.

In the above embodiment, the mounting structure 162 has been described as including a structure that is compatible with a DIN rail installed in a control panel, but this configuration is not limiting. The mounting structure 162 may include any structure capable of mounting the signal processing device 10 onto any installation target by, for example, screwing, fitting, or engaging. For example, the mounting structure 162 may include a screw-fastening structure and a wall-mounting structure instead of, or in addition to, a DIN rail-compatible structure.

In the above embodiment, the output interface 14 and the insertion slot 163 have been described as being disposed on the second side S2, but this configuration is not limiting. The insertion slot 163 may be disposed on any side of the housing 161 other than the second side S2.

In the above embodiment, only one insertion slot 163 is provided in the housing 161, but this configuration is not limiting. A plurality of insertion slots 163 may be provided in the housing 161.

Some embodiments of the present disclosure are exemplified below. It should be noted that the embodiments of the present disclosure are not, however, limited to these examples.

[Appendix 1] A signal processing device comprising:
a housing;
an input interface configured to receive input of an electrical signal;
a converter configured to convert the electrical signal inputted to the input interface into a communication signal according to a communication protocol for wireless communication; and
an output interface configured to output the communication signal converted by the converter for wireless communication, wherein
the signal processing device comprises the housing, the input interface, the converter, and the output interface integrally, and
the input interface is disposed on a first side of the housing, and the output interface is disposed on a second side opposite the first side in the housing.

[Appendix 2] The signal processing device according to appendix 1, wherein the output interface includes an antenna cable connector to which a cable, connected to a wireless communication antenna, is connected.

[Appendix 3] The signal processing device according to appendix 2, wherein
the cable is a coaxial cable, and
the antenna cable connector is a coaxial connector.

[Appendix 4] The signal processing device according to appendix 2 or 3, wherein the antenna cable connector and the housing are not electrically connected to each other.

[Appendix 5] The signal processing device according to any one of appendices 1 to 4, wherein the housing is formed from resin.

[Appendix 6] The signal processing device according to any one of appendices 1 to 5, further comprising a mounting structure for mounting the signal processing device on a control panel, wherein
the input interface and the mounting structure are disposed on the first side.

[Appendix 7] The signal processing device according to any one of appendices 1 to 6, further comprising an insertion slot for a recording medium having recorded thereon setting information regarding the wireless communication, wherein
the output interface and the insertion slot are disposed on the second side. [Appendix 8] The signal processing device according to appendix 7, further comprising a cover member configured to cover the insertion slot. [Appendix 9] The signal processing device according to appendix 8, wherein the cover member is made of metal or resin.

The invention claimed is:

1. A signal processing device comprising:
a housing;
an input interface configured to receive input of an electrical signal;
a converter configured to convert the electrical signal inputted to the input interface into a communication signal according to a communication protocol for wireless communication; and
an output interface configured to output the communication signal converted by the converter for wireless communication, wherein
the signal processing device comprises the housing, the input interface, the converter, and the output interface integrally,
the signal processing device further comprises a mounting structure for mounting the signal processing device on an installation target, and
the input interface and the mounting structure are disposed on a first side of the housing, and the output interface is disposed on a second side opposite the first side in the housing.

2. The signal processing device according to claim 1, wherein the output interface includes an antenna cable connector to which a cable, connected to a wireless communication antenna, is connected.

3. The signal processing device according to claim 2, wherein
the cable is a coaxial cable, and
the antenna cable connector is a coaxial connector.

4. The signal processing device according to claim 2, wherein the antenna cable connector and the housing are not electrically connected to each other.

5. The signal processing device according to claim 1, wherein the housing is formed from resin.

6. The signal processing device according to claim 1, further comprising an insertion slot for a recording medium having recorded thereon setting information regarding the wireless communication, wherein
the output interface and the insertion slot are disposed on the second side.

7. The signal processing device according to claim 6, further comprising a cover member configured to cover the insertion slot.

8. The signal processing device according to claim 7, wherein the cover member is made of metal or resin.

* * * * *